United States Patent
Wang et al.

(12)

(10) Patent No.: US 6,599,401 B1
(45) Date of Patent: Jul. 29, 2003

(54) IN-PLANE ANISOTROPIC TRI-LAYERED MAGNETIC SANDWICH STRUCTURE WITH LARGE MAGNETORESISTANCE EFFECT

(75) Inventors: Jian-Qing Wang, New Orleans, LA (US); Leszek M. Malkinski, Warszawa (PL)

(73) Assignee: University of New Orleans Research and Technology Foundation, Inc., New Orleans, LA (US)

( * ) Notice: Subject to any disclaimer, the term of this patent is extended or adjusted under 35 U.S.C. 154(b) by 0 days.

(21) Appl. No.: 09/811,826

(22) Filed: Mar. 19, 2001

Related U.S. Application Data

(60) Provisional application No. 60/190,712, filed on Mar. 17, 2000.

(51) Int. Cl.[7] .............................. C23C 14/35; G11B 5/66; G11B 5/70
(52) U.S. Cl. ..................... 204/192.2; 360/313; 360/324; 360/324.1; 428/694 T; 428/395 TS; 428/694 TP; 428/694 TM
(58) Field of Search .......................... 204/192.15, 192.2; 360/313, 324, 324.1; 428/694 T, 694 TS, 694 TP, 694 TM

(56) References Cited

U.S. PATENT DOCUMENTS

| | | | | |
|---|---|---|---|---|
| 5,422,621 A | * | 6/1995 | Gambino et al. | 338/32 R |
| 5,585,986 A | * | 12/1996 | Parkin | 360/113 |
| 5,742,458 A | * | 4/1998 | Koike et al. | 360/113 |
| 6,262,869 B1 | * | 7/2001 | Lin et al. | 360/324.11 |

FOREIGN PATENT DOCUMENTS

| JP | 56-130470 | * 10/1981 | ............ C23C/15/00 |

* cited by examiner

*Primary Examiner*—Steven H. VerSteeg
(74) *Attorney, Agent, or Firm*—Garvey, Smith, Nehrbass & Doody, L.L.C.; Seth M. Nehrbass

(57) ABSTRACT

Uniaxial magnetic anisotropy was found in the Fe/Co/Cu/Co magnetoresistive structures deposited on Si (100) substrates. Samples magnetized along an easy anisotropy axis showed extremely sharp magnetization and magnetoresistance switching at low fields and maximum giant magnetoresistance of 9.5% at 5K (5.5% at room temperature) for the samples with 5 nm of Fe, 5 nm of Co, 2.5 nm of Cu and 2 nm of Co. These results were advantageous compared to Co/Cu/Co trilayers grown on Cr/Cu buffer which did not exhibit uniaxial anisotropy. Deposition on spinning wafers allowed excluding substrate related anisotropy. An existing magnetic field in the magnetron sputtering system with the strength of 32 Oe at the sample location was found the most probable source of the induced uniaxial anisotropy.

20 Claims, 2 Drawing Sheets

IN-PLANE ANISOTROPIC TRI-LAYERED MAGNETIC SANDWICH STRUCTURE WITH LARGE MAGNETORESISTANCE EFFECT

CROSS-REFERENCE TO RELATED APPLICATIONS

Priority of U.S. Provisional Patent Application Serial No. 60/190,712, filed Mar. 17, 2000, incorporated herein by reference, is hereby claimed.

STATEMENT REGARDING FEDERALLY SPONSORED RESEARCH OR DEVELOPMENT

This work was sponsored by the DOD/DARPA grant No. MDA972/97-1-003 through Advanced Materials Research Institute, University of New Orleans, New Orleans, La. 70148, USA. The U.S. government may have rights in this invention.

REFERENCE TO A "MICROFICHE APPENDIX"

Not applicable

BACKGROUND OF THE INVENTION

1. Field of the Invention

The present invention relates to spin valves. More particularly, the present invention relates to spin valves having good switching characteristics and a strong anisotropy in these characteristics.

2. General Background of the Invention

Current readily available commercial field sensors rely mainly on two types of technologies and materials, neither of which is desirable in overall performance, material usage and economical considerations. The first type is the flux gate technology that incorporates complicated electronics with specific structures made of soft magnetic materials. The flux gate sensors are bulky, power demanding, and very costly. Especially, when the need arises to measure three dimensional field distribution three independent flux gate gages are required to carry out the job, further increasing the cost and power consumption.

The second type of sensors is the so-called Hall sensor. The conventional Hall sensors use the Hall voltage induced by a magnetic field in semiconductor system to probe the local magnetic fields. Most of them are doped semiconductors with controlled impurity densities to achieve required sensitivity. The main problem is that the sensitivity is generally sacrificed by temperature instability, which for doped semiconductors is quite poor due to the exponential dependence of carrier density with temperature. Also, the sensitivity of the Hall sensors is not as high.

A good background discussion of spin valves can be found in U.S. Pat. No. 5,919,580.

The following U.S. Patents are incorporated herein by reference:
Pat. No. Title
1. U.S. Pat. No. 6,031,692, Magentoresistive deice and magnetoresistive head
2. U.S. Pat. No. 6,013,365, Multi-layer structure and sensor and manufacturing process
3. U.S. Pat. No. 5,993,566, Fabrication process of Ni-Mn spin valve sensor
4. U.S. Pat. No. 5,948,553, Magnetic multiplayer structure having magnetoresistance ration and large magnetic sensitivity base on the giant magnetoresistance effect and process of fabrication thereof
5. U.S. Pat. No. 5,942,309, Spin valve magnetoresistive device
6. U.S. Pat. No. 5,919,580, Spin valve device containing a Cr-rich antiferromagnetic pinning layer
7. U.S. Pat. No. 5,909,345, Magnetoresistive device and magnetoresistive head
8. U.S. Pat. No. 5,871,622, Method for making a spin valve magnetoresistive sensor
9. U.S. Pat. No. 5,843,589, Magnetic layered material, and magnetic sensor and magnetic storage/read system based theron
10. U.S. Pat. No. 5,701,222, Spin valve sensor with antiparallel magnetization of pinned layers
11. U.S. Pat. No. 5,648,885, Gaint magnetoresistive eeffect sensor, particularly having a multilayered magnetic thin film layer
12. U.S. Pat. No. 5,514,452, Magnetic multiplayer film and magnetoresistance element An article entitled "Quantum size effect and magnetoresistance in spin-valved Co/Cu/Co trilayer structures" by Z. T. Diao, S. Tsunashima and M. Jimbo, in the J. Appl. Phys. vol. 85 no.3 pp. 1679–88, 1999 discusses electron transport and the magnetoresistance of magnetron sputtered ultrathin Co(M1)/Cu/Co(M2) trilayer structures. These properties are presented as a function of magnetic and nonmagnetic layer thicknesses on 5 nm Fe layer; a quantum well states model is applied to interpret the electron transport data; this approach represents a beyond free-electron approximation that takes into model calculations details of the electronic band structure of the trilayers and spin-dependent scattering by impurities and/or at interfaces. The article is limited to model treatment of magneto-electron transport properties and are not concerned with good magnetic switching characteristics and field sensitivity. In fact as presented in FIG. 1 of the article the low field magnetoresistance switching characteristics are rather poor.

BRIEF SUMMARY OF THE INVENTION

The apparatus of the present invention solves the problems confronted in the art in a simple and straightforward manner. What is provided are spin valves having good switching characteristics and a method of producing the spin valves.

Uniaxial magnetic anisotropy is found in the Fe\Co\Cu\Co magnetoresistive structures deposited on Si (100) substrates. Samples show extremely sharp magnetization and magnetoresistance switching at low fields along an easy anisotropy axis, with large value of giant magnetoresistance effect (e.g. 9.5% at cryogenic temperatures and 5.5% at room temperature). The samples consist of a Fe buffer, a thicker lower Co layer, a thin Cu spacer and a thin upper Co layer. Also, a thin capping layer of either Cu or Cr may be used. These samples are advantageous compared to other spin valves on nonmagentic buffer layer and do not exhibit strong uniaxial anisotropy. The samples are made in a magnetron sputtering high vacuum deposition system. The strong magnetic anisotropy is induced by applying a magnetic field during the deposition process. It is especially important to use a magnetic. seed layer in the magnetic field to produce textured structure with the desirable anisotropy. A magnetic field is produced by a magnet or a current coil placed in the vicinity of the wafer or substrate on which the spin valve films are to be deposited during the deposition process. The magnetic field is to help textured growth of the magnetic seed layer and the subsequent magnetic layers. The good textured growth of non-magnetic layers also follows.

Magnetic field sensors are extensively used in various applications ranging from electronic compass, motion sensors, positioning sensors, magnetic recording head, to nonvolatile random access memory, and light weight magnetometer, to name a few. The existing difficulties with the current field sensor technologies, of low sensitivity, heavy weight, high power consumption, low stability and high cost, can be overcome by these newly discovered field sensitive materials such as the spin valve materials. These sensors provide a solid-state solution for small size, low cost, low power, and microelectronic ready field sensors. Especially directional sensing capability in the current invention is a new feature that can be used to determine the Earth's magnetic field, determine the orientation of a vehicle in space or on the ocean's surface, and determine large ferrous objects such as automobiles, ship and airplane by detecting the disturbances of the Earth's magnetic field. They can also be used in buoys to detect tidal waves by detecting the direction and height variation of the buoy. In microelectronic and memory chip technologies they can be used to simplify the circuit construction improve the modes of bit operations, lower the manufacturing costs, and improve the performance characteristics.

BRIEF DESCRIPTION OF THE SEVERAL VIEWS OF THE DRAWINGS

For a farther understanding of the nature, objects, and advantages of the present invention, reference should be had to the following detailed description, read in conjunction with the following drawings, wherein like reference numerals denote like elements and wherein.

DETAILED DESCRIPTION OF THE INVENTION

Figure 1:
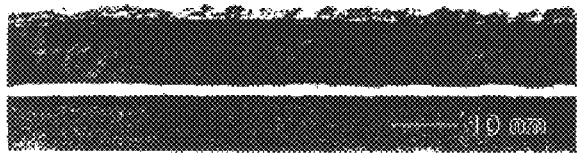
FIG. 1 is a representative TEM image of the cross-section of the spin-valve.

The paper entitled "In-Plane Anisotropy in Fe\Co\Cu\Co Spin Valves" attached to U.S. Provisional Patent Application Serial No. 60/190,712, is incorporated herein by reference. The figures referred to herein can be found in that paper.

Also incorporated herein by reference are the abstract and the copies of slides attached to U.S. Provisional Patent Application Serial No. 60/190,712

I. INTRODUCTION

Transition metal thin films deposited by sputtering tend to grow in the form of polycrystalline structures with randomly distributed anisotropy directions of individual grains. However, in specific deposition conditions a textured growth of ultrathin magnetic films has been observed [1]. The character of growth can be controlled by deposition conditions such as Ar pressure, deposition rate, kind of substrate or seed layer, angle of incidence of deposited material with respect to substrate, substrate spinning rate or magnetic field applied during deposition [2,3]. Crystallographic texture due to deposition technique or microstructure modifications due to post-deposition treatments (field- or stress-annealing) can give rise to induced magnetic anisotropy [4]. In addition to magnetocrystalline anisotropy, which usually determines magnetic properties of bulk materials, surface effects were found to be important for magnetic behavior of thin magnetic films, e.g. [5]. Among different anisotropy types the uniaxial anisotropy seems to be the most desirable for controlling magnetization processes in spin valves because it leads to a very sharp magnetization reversal when magnetic field is applied along easy anisotropy axis and consequently high field sensitivity of magnetoresistance and enhanced magnetoresistance performance. Our spin-valves composed of Fe buffer layer and magnetoresistive Co/Cu/Co trilayer exhibit differences in field dependencies of magnetization and magnetoresistance for different in-plane magnetization directions which indicates existence of induced uniaxial anisotropy. The aim of this work is to reveal the source of the induced anisotropy in our samples by changing deposition conditions.

II. EXPERIMENTAL

Giant magnetoresistive structures consisting of Fe buffer layer, thicker lower and thinner upper Co layers separated by a nonmagnetic Cu spacer were deposited on Si (100) wafers with natural oxide using magnetron sputtering. The vacuum base pressure was better than $1.0 \times 10^{-7}$ Torr, Ar pressure was 3 mTorr and deposition rates were 1 Å/s for Fe and Co and 2 Å/s for Cu. The deposition rates were calibrated using a sensitive profilometer (Tencor). The pseudo-spin-valves with different thickness values of the constituent layers were deposited in order to optimize their magnetoresistance performance. The samples were deposited on stationary and spinning wafers. The in-plane crystallographic orientation of the wafers and the angle of incidence of deposited material were varied. The microstructure of the samples was studied using transmission electron microscope (JOEL 2010). Magnetization hysteresis loops in the temperature range from 5 K to 300 K were measured using SQUID magnetometer (Quantum Design). Resistivity dependencies on magnetic field were measured in the Physical Properties Measurement System (Quantum Design) using four-probe method.

III. RESULTS AND DISCUSSION

Figure 2:
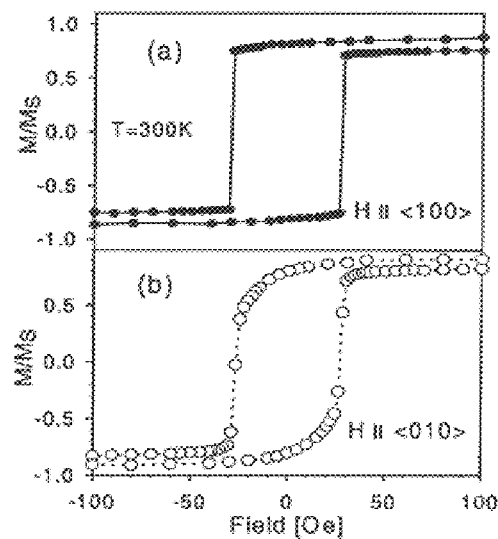
FIG. 2 shows magnetization hysteresis loops measured along <100> and <010> crystallographic axis of Si wafer.
Figure 3:
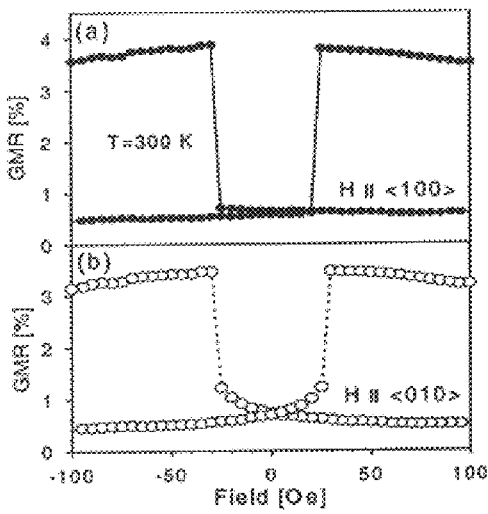
FIG. 3 shows room temperature magnetoresistance hysteresis loops for samples cut in transverse directions.

Transmission electron microscope image of the sample cross-section shows good alignment of the layers and smooth surfaces, without evidence of pinholes, as seen in FIG. 1. The microstructure of samples deposited on stationary wafers reveals tilted columnar growth of the lower Co layer. Typical magnetization and magnetoresistance dependencies on magnetic field for the samples cut along (100) and (010) crystallographic directions of Si are presented in FIGS. 2 and 3.

The character of these curves at low fields is representative for both room and low temperature measurements. The samples cut under the angle of 45° to the (100) direction demonstrated intermediate magnetic behavior compared to those measured along (100) and (010) Si axes. From the relative magnitude of the magnetization jump at the coercive field of 27 Oe to the saturation magnetization of the spinvalve it can be deduced that the thicker lower magnetic layer composed of exchange coupled Fe and Co reverses its magnetization at the low field. Our research was focused on studies of anisotropic behavior of this particular layer. Because of the thickness of the Cu spacer ranging from 2.5 to 2.7 nm a weak coupling between Co layers was expected and consequently the influence of the upper layer was found insignificant for the switching properties of the lower layer. Sharp magnetization reversal along (100) direction versus more gradual switching along intermediate and transverse directions indicate existence of uniaxial magnetic anisotropy.

There can be several reasons for the induced.anisotropy as mentioned in the introduction. Some works report that uniaxial anisotropy can be induced in thin magnetic films by the vicinal Si substrate [6]. Thus the question arises whether we can observe any evidence of substrate influence on the film structure in the case of Si wafers with the native oxide. This can be tested either by changing orientation of the wafer by a certain angle (e.g. 45° oor 90°) during deposition on stationary wafer or by spinning the wafer during deposition. In the latter case the wafers were placed on the planetary motion system which provided their spinning. The magnetization and magnetoresistance curves measured for different directions in the spinning samples were almost identical which excludes substrate as a possible source of the anisotropy.

One main reason is the microstructure modification by varying deposition conditions. It is known that thin films growth can be strongly affected by specific deposition conditions. They were found important for uniaxial anisotropy in epitaxially grown Fe and FeNi thin films on MgO (100) and Si (111) substrates [7,8]. Recently it was demonstrated that glancing angle deposition of Fe films results in tilted columnar growth [1] somewhat similar to that observed in our samples. However, in our sputtering system deposition on stationary substrates tilted ±30° did not enhance the anisotropic character of the magnetization and magnetoresistance curves. This experiment suggests that the angle of incidence of the magnetic atoms (in the range from 0 to 30°) may have minor influence on the anisotropy of the lower magnetic layer. This layer consists of Fe and Co, thus it is interesting to test contributions of each layer to the anisotropy by depositing Fe/Cu/Co and Co/Cu/Co structures on Si. Anisotropic behavior was found for both structures, but pronounced effect was found in the case of the Co\Cu\Co spin valve. It should be noticed, however that the growth of Co on Si can differ from that on Fe.

Figure 4:
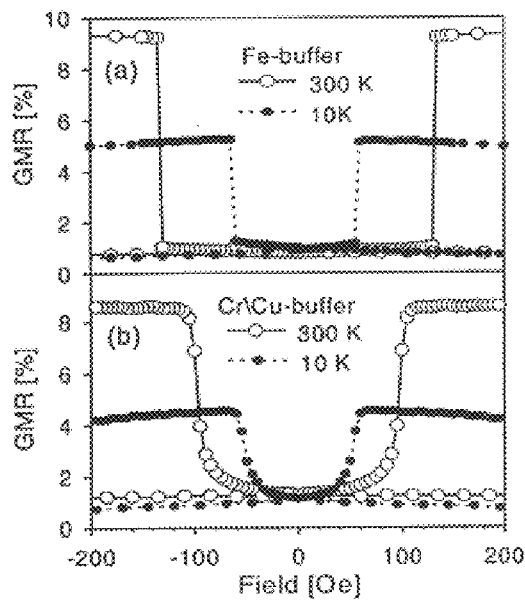
FIG. 4 shows magnetoresistance field dependencies at 10 K and room temperature of the Co\Cu\Cu spin-valves deposited on (a) Fe-buffer and (b) Cr\Cu buffer.
Figure 5:
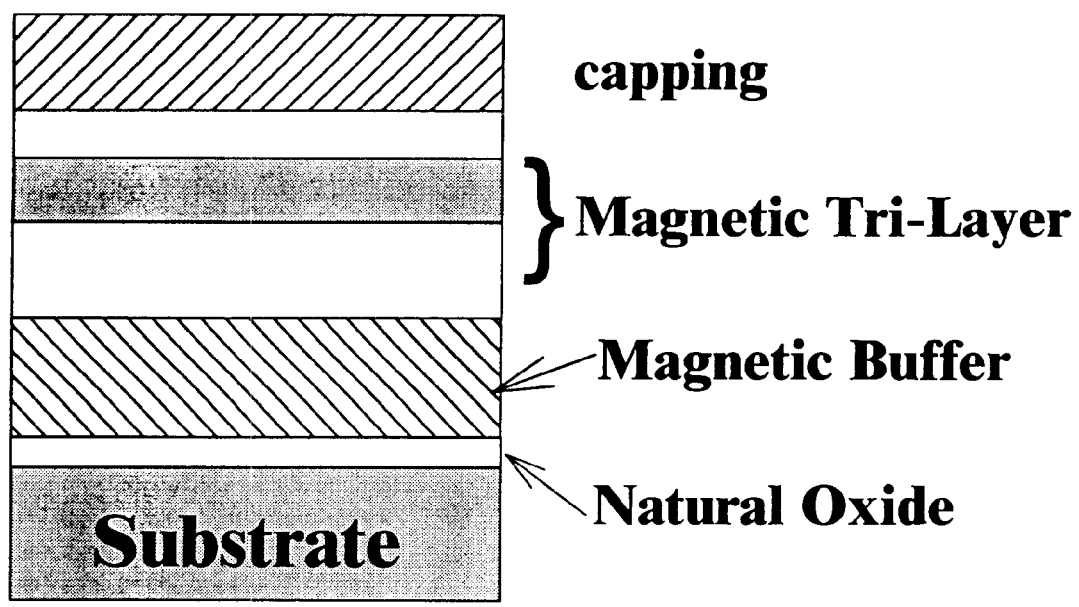
FIG. 5 is a schematic of the tri-layer structure arrangement of the present invention.

Magnetic field applied during deposition can be effective in inducing uniaxial anisotropy in thin magnetic films, e.g. [3]. This method is the most effective for binary and ternary magnetic alloys which exhibit pair ordering [4], however it is also expected that magnetic field can influence the growth of single magnetic elements. In this case magnetic order can be related to the arrangement of defects within magnetic materials or pair ordering of Fe and Co atoms at the Fe/Co interface. In fact, film growth in a magnetic field is a very likely reason for induced anisotropy in our samples since magnetic field with the strength of 32 Oe was measured at the sample location in our magnetron sputtering system. This field seems to be sufficient to induce significant uniaxial anisotropy observed in our samples. The importance of the Fe buffer and the Fe/Co interface for inducing, anisotropy seems to be supported by the lack of anisotropy in Co\Cu\Co magnetoresistive structures with Cr\Cu buffer layer deposited in the same sputtering system [9]. The magnetoresistance value in these spin valves was somewhat smaller (8.5% at 5 K and 4.2% at room temperature) than for the samples with Fe buffer and the magnetization reversal at low fields was more gradual resulting in GMR field sensitivity below 1.0%/Oe. Moreover, the sharpness of the magnetoresistance switching at low fields deteriorates with increasing temperatures unlike for the structures with Fe, for which equally sharp switching was observed at low and room temperatures. A comparison between magnetoresistance field dependencies of the two structures is presented in FIG. 4. It is worth to mention that the magnetoresistance of 9.5% measured at 10 K and 5.5% at room temperature is comparable to the results achieved by the others [10], but the switching characteristics are much better in our spin valves with induced uniaxial anisotropy.

IV. CONCLUSIONS

Uniaxial magnetic anisotropy induced in the Fe\Co\Cu\Co layered structures resulted in a very sharp switching of magnetoresistance at low fields. The GMR field sensitivity reached 2.0%/Oe. Due to good layer alignment the magnetoresistance of the structure with 5 nm thick Fe and Co layers and 2 nm upper Co layer was 9.5% at 5 K and 5.5% at room temperature. A magnetic field existing in the magnetron sputtering system with the strength of 32 Oe was found to be responsible for the growth induced anisotropy.

V. ACKNOWLEDGMENT

Dr. Weilie Zhou from AMRI/UNO contributed in the microscopy studies.

VI. REFERENCES (All Incorporated Herein by Reference)

[1] F. Liu, M. T. Ulmor, L. Shen, J. Weston, W. Eads, J. A. Barnard and G. and J. Mankey, "The growth of nanoscale structured iron films by glancing angle deposition", J. Appl. Phys., 85, pp. 5486–8, 1999

[2] U. Grandmann, in: Handbook of Magnetic Materials, ed. Buschow, North-Holland, Netherlands, ch. 1. 1993

[3] T. Yeh, L. Berg, J. Falenschek, J. Yue, "Induced magnetic anisotropy of sputter NiFe thin films on tantalum nitride underlayer", Mat. Research Society Proc. vol. 384, pp. 233–8, 1995

[4] S. Chikazumi, Physics of Ferromagnetism,. Calderon Press, Oxford, N.Y. 1997, Chapter 13

[5] D. S. Chuang, C. A. Ballentine and R. C. O'Handley, "Surface and step magnetic anisotropy", Phys. Rev. B 49 (21) 15084

[6] H.-J. Kim, B.-L. Lee and S. K. Joo, "Comparison of uniaxial magnetic anisotropy of metallic thin films grown on vicinal (111) and (100) Si surfaces", IEEE Trans. Magn. 35 pp. 3814–16, 1999

[7] J. R. Childress, O. Durand, F. Nguyen Van Dau, P. Galtier, R. Bisaro and A. Schuhl, "Process-induced anisotropy in epitaxial Fe and $Ni_{80}Fe_{20}$ Films", Mat. Research Soc. Proc. vol 384 pp. 203-207, 1995

[8] O. Durand, J. R. Childress, P. Galtier, R. Bisaro and A. Schuhl, "Origin of the uniaxial magnetic anisotropy in Fe films grown by molecular beam epitaxy",J. Magn. Magn. Mat., vol. 145, pp.111–117, 1995

[9] M. Malkinski, J. Q. Wang, W. L. Zhou, J. M. MacLaren, C. A. Ross, "Improvement of GMR performance of a metal layered structure", J. Appl. Phys. vol. 87, pp. 6394–96, 2000.

[10] Z. T. Diao, S. Tsunashima and M. Jimbo, "Quantum size effect and magnetoresistance in spin-valved Co/Cu/Co trilayer structures" J. Appl. Phys. vol. 85 no.3 pp. 1679–88, 1999

All measurements disclosed herein are at standard temperature and pressure, at sea level on Earth, unless indicated otherwise. All materials used or intended to be used in ahuman being are biocompatible, unless indicated otherwise.

The foregoing embodiments are presented by way of example only; the scope of the present invention is to be limited only by the following claims.

What is claimed is:

1. A method of making giant magnetoresistive structures magnetized along an easy anisotropy axis, comprising:
   depositing on Si (100) wafers with natural oxide using a magnetron sputtering system while providing an existing magnetic field in the magnetron sputtering system with a strength in the range of 10 to 40 Oe at a sample location:
   a Fe buffer layer, and
   lower and upper Co layers separated by a nonmagnetic Cu spacer, wherein:
   vacuum base pressure is better than $2 \times 10^{-7}$ Torr,
   Ar pressure is in the range of 2–10 mTorr, and
   deposition rates are in the range of 0.5 to 4 Å/s for Fe, Co, and Cu.

2. The invention of claim 1, wherein the structure includes a thin capping layer of either Cu or Cr.

3. The invention of claim 1, wherein the lower Co layer is thicker than the upper Co layer.

4. The invention of claim 1, wherein the structure includes a thin capping layer of either Ta or any non-magnetic metal.

5. A spin valve made of the structure of claim 1.

6. Apparatus including the spin valve of claim 5.

7. A method of making giant magnetoresistive structures magnetized along an easy anisotropy axis, comprising:
   while providing an existing magnetic field in a magnetron sputtering system with a strength in the range of 10 to 40 Oe at a sample location, depositing on natural Si wafers or other insulating substrates with natural oxide using magnetron sputtering:
   a Fe buffer layer, and
   lower and upper Co layers separated by a nonmagnetic Cu spacer.

8. The method of claim 7 wherein:
   vacuum base pressure is better than $2 \times 10^{-7}$ Torr,
   Ar pressure is in the range of 2–10 mTorr, and
   deposition rates are in the range of 0.5 to 4 Å/s for Fe, Co, and Cu.

9. A method of making giant magnetoresistive structures magnetized along an easy anisotropy axis, comprising:
   while providing an existing magnetic field in a magnetron sputtering system with a strength in the range of 10 to 40 Oe at a sample location, depositing on natural Si wafers or other insulating substrates using magnetron sputtering:
   a buffer layer, and
   lower and upper Co layers separated by a nonmagnetic spacer.

10. The method of claim 9, wherein:
    vacuum base pressure is better than $2 \times 10^{-7}$ Torr,
    Ar pressure is in the range 2–10 mTorr, and
    deposition rates are in the range of 0.5 to 4 Å/s for the buffer layer, Co, and the non-magnetic spacer.

11. The method of claim 9, wherein:
    the buffer layer comprises Fe or a Fe alloy; or Co, or Co alloy;
    the non-magnetic spacer comprises conductors or insulators.

12. The method of claim 9, wherein: the buffer layer comprises Cr, or Ta, or Cu, or other nomnagnetic metals; the non-magnetic spacer comprises conductors or insulators.

13. A giant magnetoresistive structure magnetized along an easy anisotropy axis comprising:
    a Fe buffer layer,
    lower and upper Co layers separated by a nonmagnetic Cu spacer, wherein the layers are deposited on natural Si wafers or other insulating substrates with natural oxide using a magnetron sputtering system, while providing an existing magnetic field in the magnetron sputtering system with a strength in the range of 10 to 40 Oe at a sample location.

14. The structure of claim 13, wherein during deposition of the layers vacuum base pressure is better than $2 \times 10^{-7}$ Torr, Ar pressure is in the range 2–10 mTorr and deposition rates are in the range of 0.5 to 4 Å/s for Fe, Co, and Cu.

15. A giant magnetoresistive structure magnetized along an easy anisotropy axis comprising:
    a buffer layer having a thickness of 2–7 nm, a lower Co layer having a thickness of 2–7 nm and an upper Co layer having a thickness of 1–4 nm, the two Co layers separated by a nonmagnetic spacer having a thickness of 1–5 nm, wherein the layers are deposited on natural Si wafers or other insulating substrates with natural oxide using a magnetron sputtering system, while providing an existing magnetic field in the magnetron sputtering system with a strength in the range of 10 to 40 Oe at a sample location.

16. A giant magnetoresistive structure magnetized along an easy anisotropy axis comprising:
    a buffer layer having a thickness of 2–20 nm,
    a lower Co layer having a thickness of 2–10 nm, and
    an upper Co layer having a thickness of 1–4 nm, the two Co layers separated by a nonmagnetic spacer having a thickness of 1–7 nm, wherein the layers are deposited on natural Si wafers or other insulating substrates with natural oxide using a magnetron sputtering system, while providing an existing magnetic field in the magnetron sputtering system with a strength in the range of 10 to 40 Oe at a sample location.

17. The invention of claim 16, wherein the buffer layer has a thickness of 7–20 nm.

18. The invention of claim 16, wherein the buffer layer has a thickness of 3–10 nm.

19. A giant magnetoresistive structure magnetized along an easy anisotropy axis comprising:
    a buffer layer having a thickness of at least 1 nm,
    a lower Co or Co alloy layer having a thickness of 1–30 nm, and
    an upper Co or Co alloy layer having a thickness of 1–30 nm, the two Co or Co alloy layers separated by a nonmagnetic spacer having a thickness of 1–7 nm, wherein the layers are deposited on natural Si wafers or other insulating substrates with natural oxide using a magnetron sputtering system, while providing an existing magnetic field in the magnetron sputtering system with a strength in the range of 10 to 40 Oe at a sample location.

20. The invention of claim 19, wherein the buffer layer has a thickness of 2–6 nm, the lower Co or Co alloy layer has a thickness of 4–8 nm and the upper Co or Co alloy layer has a thickness of 2–5 nm, and the nonmagnetic spacer has a thickness of 1–3 nm.

* * * * *